United States Patent [19]
Loewen

[11] Patent Number: 5,017,776
[45] Date of Patent: May 21, 1991

[54] APPARATUS FOR AND METHODS OF OPTICAL ENCODING HAVING SPIRAL SHAPED LIGHT MODULATOR

[75] Inventor: Victor D. Loewen, San Jose, Calif.

[73] Assignee: Hewlett-Packard Company, Palo Alto, Calif.

[21] Appl. No.: 448,037

[22] Filed: Dec. 8, 1989

Related U.S. Application Data

[63] Continuation-in-part of Ser. No. 321,994, Mar. 10, 1989, Pat. No. 4,952,799.

[51] Int. Cl.⁵ .............................................. G01D 5/34
[52] U.S. Cl. .......................... 250/231.14; 250/231.16; 250/237 G
[58] Field of Search ...................... 250/231.10, 231.14, 250/231.16, 231.19, 237 G; 33/707; 341/13; 356/375, 395, 396; 324/175

[56] References Cited

U.S. PATENT DOCUMENTS

| | | | |
|---|---|---|---|
| 3,757,128 | 9/1973 | Vermeulen | 250/231.16 |
| 4,253,021 | 2/1981 | Ernst | 250/231.14 |
| 4,691,101 | 9/1987 | Leonard | 250/231 |

*Primary Examiner*—David C. Nelms
*Assistant Examiner*—Que T. Le

[57] ABSTRACT

Disclosed are apparatus and methods for transducing mechanical movement into electrical signals indicative of the movement. The apparatus is an improved optical encoder of the type having a source of light, a code wheel for modulating the light according to movement of the object whose position is being measured and a photo detector for receiving the modulated light. The code wheel modulates the light from the light source into spiral-shaped beams of light separated by columns of spiral-shaped dark areas. Photo detectors are oriented to receive the modulated light.

22 Claims, 6 Drawing Sheets

APPARATUS FOR AND METHODS OF OPTICAL ENCODING HAVING SPIRAL SHAPED LIGHT MODULATOR

RELATED APPLICATIONS

This application is a continuation-in-part of Application Ser. No. 321,994, filed Mar. 10, 1989 now U.S. Pat. No. 4,952,799, which is incorporated herein by reference.

FIELD OF THE INVENTION

The present invention relates to apparatus for and methods of converting mechanical movement into electrical signals indicative of the movement. More particularly, the invention relates to an optical shaft angle encoder for producing electrical signals indicative of the angular position or motion of a shaft.

BACKGROUND OF THE INVENTION

Incremental optical encoders are frequently used for resolving the position or measuring the rotation of a shaft. For 15 example, optical encoders are widely used in instruments such as plotters to monitor the speed and shaft position of internal electric motors. Optical encoders are also used in devices for controlling the output of electronic instruments. In instruments such as oscilloscopes, for example, the resolution or frequency of the oscilloscope display is often adjusted by means of an optical encoder coupled to a control knob or wheel.

In typical prior art applications, as shown in FIG. 1, an opaque code wheel 100 is coupled to the shaft 110 of a control knob 111 so that movement of the shaft results in like movement of the code wheel. Wheel 100 contains a plurality of transparent windows 101 in a track around the circumference of the wheel. A light source 102 is provided adjacent to one face of wheel 100 and in alignment with the track of windows 101. A photo detector on printed circuit board 103 is placed on the side of wheel 100 opposite light source 102. As wheel 100 rotates, illumination from light source 102 passes through windows 101 and is detected by the photo detector. Electronic circuitry connected to the photo detector is used to determine the number of windows 101 which pass light source 102 as wheel 100 rotates. A phase plate 104 is mounted to the encoder housing 105 and aligned concentrically relative to shaft 110 such that the relative angle between phase plate 104 and code wheel 100 changes as the shaft rotates.

According to the operation of the encoder shown in FIG. 1, a modulated light beam passing through the track of windows is received by the areas 106 and 107 of phase plate 104. Phase plate areas 106 and 107 are oriented out of phase relative to the periodic spacing between windows 101 of code wheel 100. Thus, as code wheel 100 turns, the light passing through phase plate areas 106 and 107 alternately achieves a maximum and a minimum. That is, when the light passing through optical area 106 reaches a maximum, the light passing through optical area 107 reaches a minimum. The light passing through area 106 is received by a first photo detector and the light passing through are 107 is received by a second photo detector. The photo detectors are connected to electronic circuitry which generates an output signal indicative of the number of times the light intensity from each area is of equal intensity. Such a signal is indicative of the relative angle between code wheel 100 and phase plate 104.

The code wheel and phase plate shown in FIG. 1 utilize trapezoidal shaped light transmissive areas. Prior art encoders of the type disclosed in FIG. 1 have also employed code wheels having spiral-shaped transmissive areas. In such devices, the phase plate is configured according to a series of complex, iterative steps so as to ensure proper modulation of the light beams from light source 102. Separate photo detectors are also used in such devices.

A recent advance in the art relates to elimination of the phase plate from optical encoder configurations. Such encoders, as disclosed in U.S. Pat. No. 4,691,101-Leonard, utilize interdigitated light detector arrays to perform the function previously performed by the phase plate. U.S. Pat. No. 4,691,101-Leonard (Leonard) is incorporated herein in its entirety. The photo detector arrays comprise, for example, four separate photo detectors which are immediately adjacent to one another and which receive information belonging to two channels. The array produces four output signals $\overline{AB}$, $\overline{AB}$, AB and $\overline{AB}$, one for each individual photo detector. These four signals are preferably produced in quadrature, that is, they are identically shaped and are 90° out-of-phase with each other.

While the arrangement disclosed in Leonard eliminates the need for a phase plate, it imposes certain other restrictions on the encoder configuration. For example, Leonard teaches that the photo detector array must have the same size and shape as one transmissive section and one non-transmissive section of the code wheel. Thus, Leonard discloses a code wheel with trapezoidal windows and a substantially identically sized and shaped photo detector array.

While the encoders taught by Leonard represent a significant advance in the art, several disadvantages are associated with the arrangement disclosed therein, especially when relatively low cost encoders are desired. As explained in co-pending application Serial No. 321,994, one disadvantage stems from having the light source and the light detectors on opposite sides of the wheel. This requires the presence of two substrates to which electrical connections must be made, which in turn complicates the positioning and alignment of components to obtain a desired precision. Each of these adds significant cost to the encoder.

Another difficulty associated with the Leonard encoder arises in applications requiring low count-per-revolution (CPR) encoders. As described by Leonard, the CPR of an optical encoder is the number of cycles the four output signals $\overline{AB}$, $\overline{AB}$, AB and $\overline{AB}$ go through in one revolution of the code wheel. As is understood by those skilled in the art, many optical encoder applications require low CPR code wheels. For example, it is desirable to utilize low CPR code wheels in connection with fine tuning control of electronic equipment. It is equally desirable for encoders and the components associated therewith to be of the smallest possible size Applicant has found, however, that it is not generally possible to simultaneously achieves both of these objectives using encoders with code wheels as taught by Leonard.

In the configuration of Leonard each photo detector array must have the same dimensions as one transmissive section plus one non-transmissive section of the code wheel. Moreover Leonard teaches that the transmissive and non-transmissive areas of the code wheel are of the same size and shape. According to the teachings of Leonard, therefore, the width of the photo detector array must increase in order to accommodate low CPR code wheels. This is contrary to the objectives of low cost and small size.

SUMMARY OF THE INVENTION

Accordingly, it is an object of the present invention to provide low CPR optical encoders which are adaptable for use with photo detectors of the smallest possible size.

It is another object of the present invention to provide low CPR optical encoders which are adaptable for use with photo detectors of conventional size and shape.

It is a further object of the invention to provide low CPR optical shaft angle encoders adaptable for us with interdigitated photo detectors.

These and other objects of the present invention are satisfied by optical encoders having a photo detector and light modulating means for projecting spiral-shaped columns of light separated by like columns of spiral-shaped dark areas onto the photo detector. The photo detector preferably comprises a photo detector array oriented with respect to the spiral-shaped columns of light such that the total amount of light falling on the photo detector array remains substantially constant upon movement of the object whose position is being measured. The modulating means preferably comprises a code wheel having a track of alternating spiral-shaped windows and spokes. Applicant has found that the use of such modulating means allows an encoder design in which photo detector width and CPR are independent variables. Accordingly, the optical encoders of the present invention comprise a source of illumination and light modulating means movable along a predetermined path for modulating the light from said source of illumination to provide alternating light and dark spiral images. A photo detector is positioned to detect the modulated light and is preferably oriented with respect to the spiral-shaped images such that the quantity of photo detector surface area illuminated by the light source remains substantially unchanged as the modulating means moves along its predetermined path.

DESCRIPTION OF PREFERRED EMBODIMENTS

The present invention relates apparatus for and methods of transducing mechanical movement into electrical signals indicative of the movement The apparatus is an improved optical encoders of the type having a source of light, means for modulating the light according to movement of the object whose position is being measured, and a photo detector array for receiving the modulated light.

THE APPARATUS

An important aspect of the present invention relates to the means used to modulate the light from the light source. Applicant has found that the objects of the present invention are generally satisfied by encoders comprising means for modulating light from the light source into spiral-shaped beams of light separated by like columns of spiral-shaped dark areas. The modulating means is coupled to the object whose position or movement is being detected such that alternating light and dark spiral-shaped images fall onto the photo detector array as the object moves along its route. The light and dark images are preferably of substantially the same size and shape. The photo detector array is preferably oriented with respect to said images such that the total area of said photo detector array exposed to said light images remains substantially constant as the images move across the photo detector array.

As the terms are used herein, a "light image" is an image comprised of light from the light source of the encoder and a "dark image" is an image characterized by the substantial absence of light from the light source. For the purposes of the present invention, a "spiral-shaped image" is an elongate image having a leading edge and a trailing edge, wherein the leading edge and the trailing edge are not substantially perpendicular to the direction of movement of the light modulating means. As disclosed more fully hereinafter, the leading edge of the spiralshaped image is generally the first side of the image to contact the photo detector array and the trailing edge is generally the last side of the image to leave the surface of the array.

Figure 1:
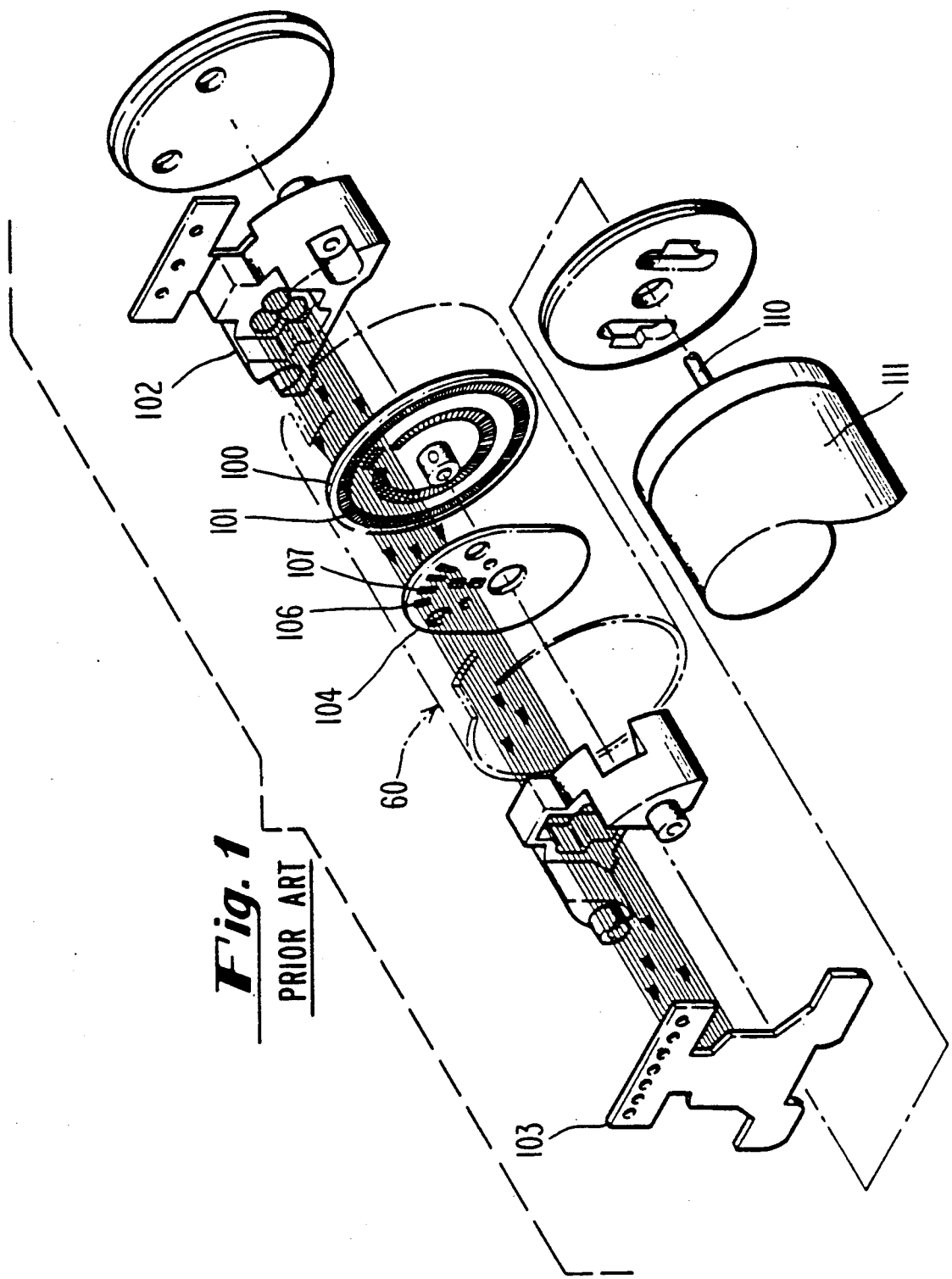
FIG. 1 is an exploded perspective view of a prior art optical shaft angle encoder.
Figure 2:
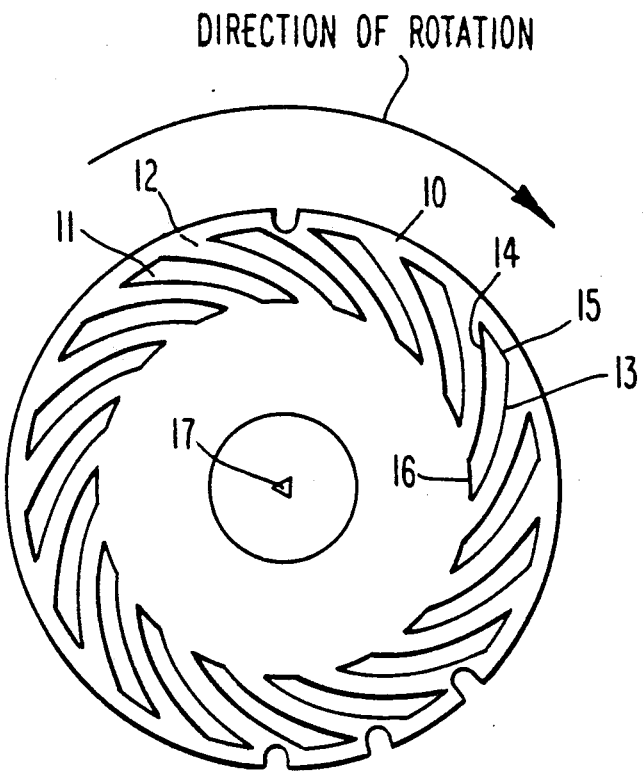
FIG. 2 is a plan view of a code wheel according to one embodiment of the present invention.

According to a preferred embodiment of the present invention, a rotatable shaft is the object whose position or movement is being detected. In such embodiments, the modulating means preferably comprises a code wheel 10, as shown in FIG. 2, concentrically mounted to the shaft for rotation therewith. An exemplary 16 CPR code wheel 10 is illustrated in FIG. 2. The code wheel carries a track of alternating spiral-shaped windows 11 and spokes 12 which form a circumferential path on the code wheel. Windows 11 and spokes 12 are preferably substantially of the same size and shape. That is, each of the plurality of windows 11 are substantially identical to one another and the areas between windows 11 are of substantially the same size and dimension as the intervening spiral-shaped windows.

Each window 11 according to the embodiment show in FIG. 2 is defined by a leading edge 13, a trailing edge 14, an upper boundary 15 and a lower boundary 16, the leading edge being substantially parallel to the trailing edge. It will be appreciated that while the designations "leading" and "trailing" are based upon the direction of motion shown in FIG. 2, these designations would be reversed for an opposite rotation of the code wheel 10. It will also be appreciated by those skilled in the art that the direction of motion of the code wheel 10, as indicated in FIG. 2, is not substantially perpendicular to either leading edges 13 or trailing edges 14. The leading edge 13 and trailing edge 14 of each window 11 are preferably characterized as having a shape defined in polar coordinates according to the following equation:

$$K = \frac{\delta\theta}{\delta R} \quad (1)$$

where
- $\delta\theta$ is the change in angle,
- $\theta$ is the change in radius, and
- K is the spiral constant, wherein the center of rotation 17 of the wheel 10 passes through the origin of the polar coordinate system. The upper boundary 15 and the lower boundary 16 of windows 11 are preferably circular arc segments having a center coincidental with the center of the code wheel.

Those skilled in the art will appreciate that Various shapes and sizes of photo detectors are adaptable for use in combination with the modulating means described herein. Although such variation is within the scope of the present invention, the present encoders preferably comprise an interdigitated photo detector array of standard size, configuration and shape, thus minimizing the need for specialized circuit chips which would increase production cost.

Figure 3:
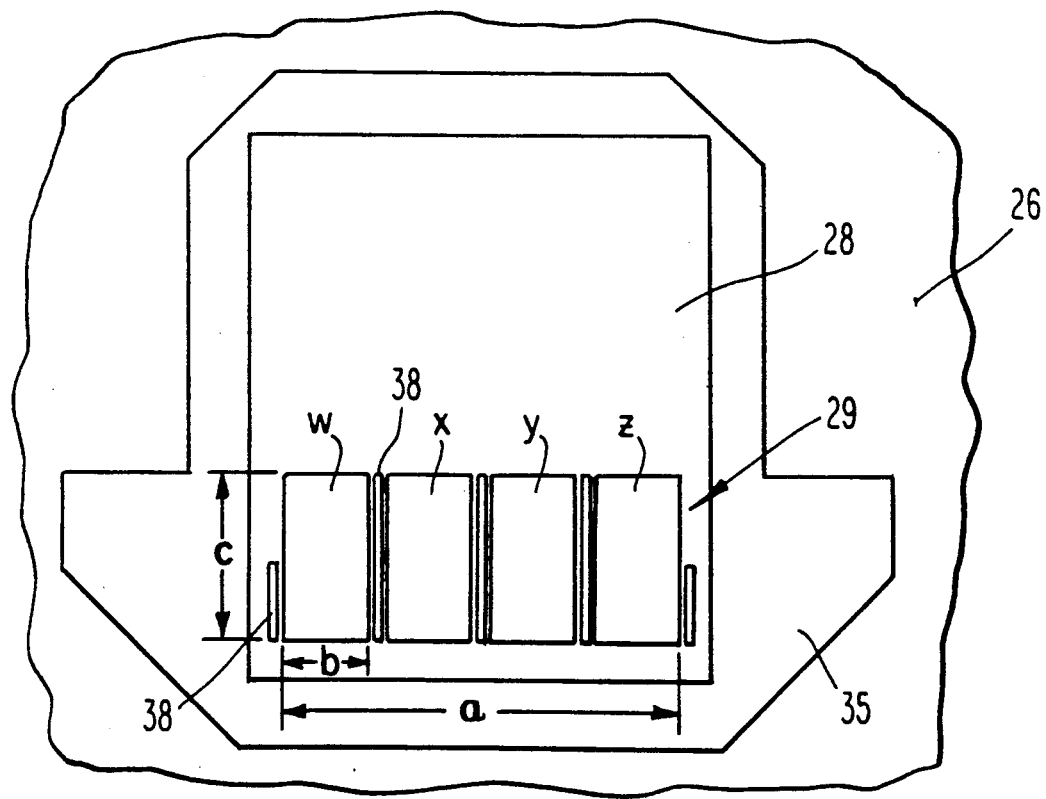
FIG. 3 is a plan view of a photo detector substrate according to one embodiment of the present invention.

With particular reference to FIG. 3, an exemplary interdigitated photo detector array 29 of standard size and shape is formed on integrated circuit substrate 28, which in turn is typically mounted on a gold grounding pad 35 on a printed circuit board 26. The term "interdigitated" is used herein in the same manner that it is used in U.S. Pat. No. 4,691,101-Leonard. An interdigitated photo detector array is a one-dimensional array in which the individual photo detectors which make up the array are immediately adjacent to one another and receive information belonging to two channels. The photo detector array 29 comprises individual photo detectors w, x, y and z. Each photo detector w, x, y and z preferably comprises a simple four sided parallelogram, such as a rectangle. As explained in U.S. Pat. No. 4,691,101-Leonard, the individual photo detectors may comprise photo diodes formed using standard bipolar semiconductor technology, although other types of technology may be used to form the photo detectors without departing from the scope of the invention. Dummy doped areas 38, shorted to a conventional isolation layer or barrier for minimizing leakage or current to and between the photo diodes, are preferably located between each photo diode area and outboard of the outermost photo diodes w and z.

As seen in FIG. 3, the photo detector array has a height c equal to about the height of the individual photo detectors and a width a which is approximately four times the width b of each photo detector. It will be appreciated, however, that this later relationship is only approximate because the dummy doped areas 38, which are located between adjacent photo detectors, increase the overall width of the photo detector slightly. The preferred photo detector array is comprised of four individual rectangular photo detector areas w, x, y and z, each area having a height c of about 760 microns and a width b of 470 microns.

Signals from the four photo diodes are preferably processed in substantially the same manner described in U.S. Pat. No. 4,691,101-Leonard. The four signals from the photo diodes are compared by way of operational amplifiers to produce two channels of output logic by which the shaft position or motion can be determined.

An important aspect of the present invention resides in the relationship between the spiral images produced by the modulating means and the position and orientation of the photo detector array used to detect the presence of those images. Applicant has found that the photo detector array is preferably positioned in the path of the spiral-shaped images and oriented in that path such that the total area of the photo detector array illuminated by the modulated light remains substantially constant as the images move across the photo detector array. When the photo detector array is comprised of a plurality of rectangular, interdigitated photo detectors 29, as illustrated in FIG. 3, the photo detector array is preferably oriented such that the portions of the leading and trailing edges of the spiral images which illuminate the photo detector array are substantially parallel to the interfaces between the individual photo detectors. This relationship is maintained as the images move across the photo detector array.

TRANSMISSIVE CODE WHEEL

Figure 4:
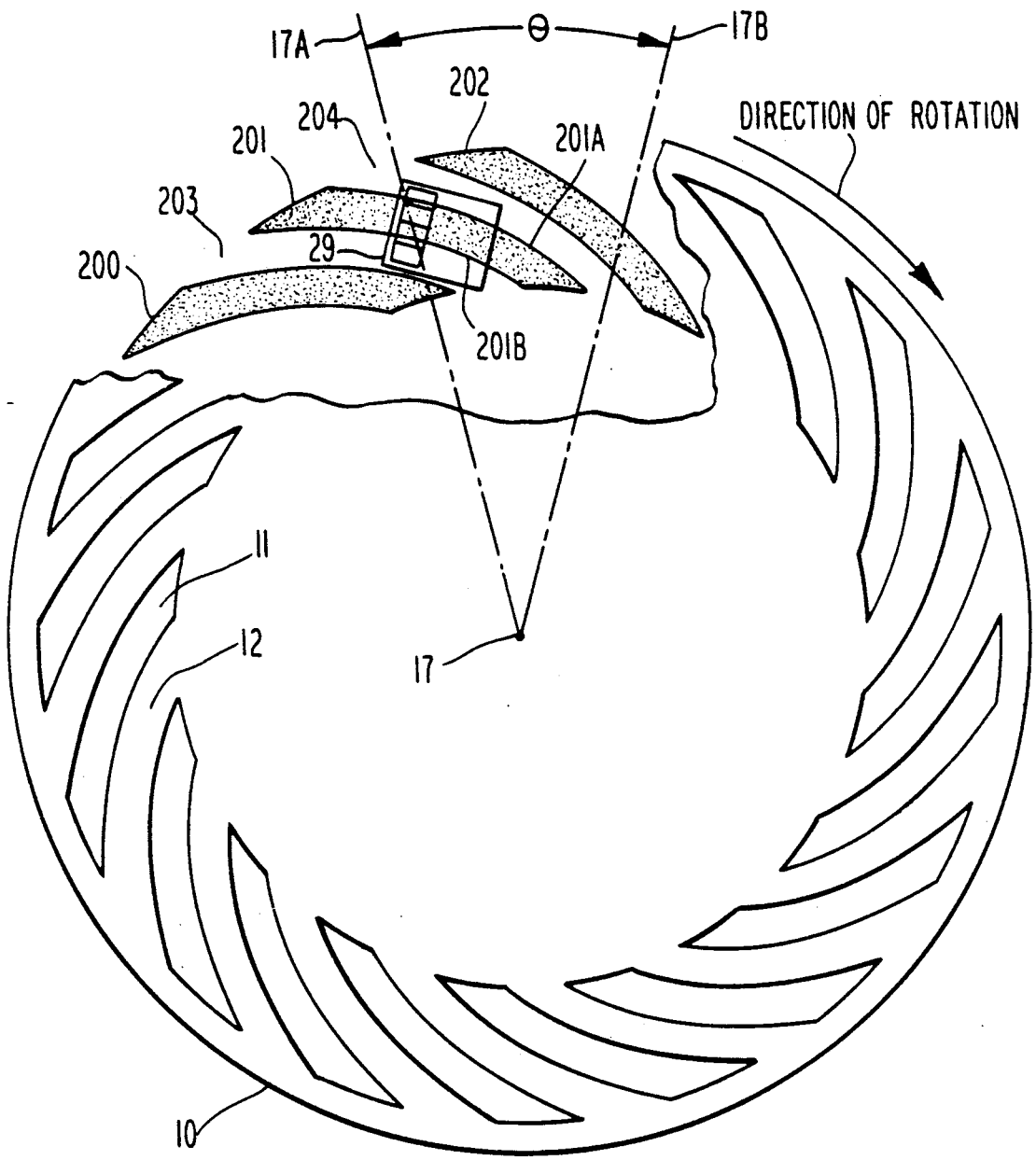
FIG. 4 is a cut-away semi-schematic view of a code wheel and a photo detector array.

With particular reference to FIG. 4, the preferred orientation of photo detector array 29 is illustrated for an embodiment in which the light modulating means comprises code wheel 10 disposed between a light source and the photo detector array 29. In FIG. 4. the light source is not shown and a section of code wheel 10 has been cut away to reveal the relationship between the spiral shaped images 200-204 and photo detector array 29. According to embodiments of the type shown in FIG. 4, the code wheel 10 is preferably constructed of an optically opaque material, such as stainless steel, and windows 11 are transmissive to the light beams produced by the light source while spokes 12 are non-transmissive. The photo detector array 29 is preferably held in a plane which is substantially parallel to the plane of code wheel 10.

As code wheel 10 rotates, the circumferential track of alternating windows 11 and spokes 12 pass through the beams of light from the light source and modulate the light to produce light spiral images 200. 201 and 202 separated by dark spiral images 203 and 204. As will be appreciated by those skilled in the art, the light source employed in transmissive code wheel embodiments is preferably a source of collimated light, as disclosed in Leonard. In this way, the projected spiral images 200-204 are substantially the same size and shape as the windows 11 and spokes 12. Thus, the magnification of the projected spiral image is unity.

Photo detector array 29 is oriented such that the area of the photo detector illuminated by the light spiral images remains substantially constant as the code wheel rotates. More particularly, photo detector array 29 is oriented to ensure that the portions of the leading edge 201A and trailing edge 201B of light spiral image 201 which fall on the array are substantially parallel to the interfaces between the individual photo detectors. Applicant has found that the proper relationship between the spiral images and the photo detector array is preferably governed according to the following equations or approximations thereof:

$$\theta = \sin^{-1}(N W/(2\pi R M)) \quad (2)$$

$$K = 360(\cos(\theta)/(N W)) \quad (3)$$

where, $\theta$ is the angle formed between a line parallel to the long side of said photo detector array, such as line 17B indicated in FIG. 4, and a radial line in the plane of said photo detector array which passes through about the center of the detector array, such as line 17A, N is the number of counts per revolution of the code wheel, W is the width of the photo detector array, R is the optical radius of photo detector array, M is the magnification of the projected image, and K is the spiral constant.

As the term is used herein, the optical radius of a photo detector array is the orthogonal distance between about the center of the photo detector array and about the axis of rotation of the code wheel. The magnification of the projected image refers to the difference in size, if any, between the projected image and the spiral spokes or windows that form that image.

According to a preferred embodiment of the type shown in FIG. 4, the optical radius of photo detector array is about 10080 microns. For transmissive code wheels, the preferred photo detector array is comprised of four individual rectangular photo detector areas w, x, y and z, each area having a height c of about 760 microns and a width b of about 470 microns. When transmissive code wheels are employed, it is preferred that the spacing between the individual photo detector areas is kept as small as possible. Accordingly, the overall width a of photo detector array 29 illustrated in FIG. 4 is preferably about 1880 microns. For a 16 CPR code wheel, therefore, the photo detector array is preferably oriented at an angle $\theta$ of about 65 with respect to radial line 17A passing through the center of the photo detector array, and the spiral constant is preferably about 0.00505. Table 1 below provides the preferred values of $\theta$ and K for transmissive code wheels having various values of CPR.

TABLE 1

Values of $\theta$ and K for transmissive code wheel having optical radius of about 5280 microns and detector width of about 1880 microns.

| N (CPR) | $\theta$ (DEG.) | K (DEG./uM) |
|---|---|---|
| 16 | 65.05° | 0.00505 |
| 12 | 42.80° | 0.0117 |
| 8 | 26.96° | 0.0213 |
| 4 | 13.10° | 0.0466 |
| 1 | 3.25° | 0.1912 |

It Will be appreciated by those skilled in the art that the inner and outer radii of the path of the spiral images may vary widely according to design considerations relating to factors such as the code wheel eccentricity and the like. However, the inner and outer boundaries of the optical path should be sufficient to ensure that the photo detector array is entirely within the optical path. For embodiments having the preferred values of R and W described above, for example, the spiral images preferably lie in a circumferential path having an inner radius of no greater than about 3050 microns and an outer radius of no less than about 7500 microns. Since the magnification of a transmissive code wheel is preferably unity, the inner boundary of windows 11 are also preferably bounded by lower circular arc segments having a radius of no greater than about 3050 microns and by upper circular arc segments having a radius of no less than about 7500.

REFLECTIVE CODE WHEEL

Another, more preferred embodiment of the present invention relates to an encoder configuration in which the photo detector array and light source are located on the same side of the code wheel 10. According to such embodiments, spokes 12 of code wheel 10 comprise reflective areas of the code wheel and windows 11 comprise non-reflective areas. For the purposes of the present invention, a reflective area is regarded as an area that specularly reflects light from the light source onto the photo detector array, and a non-reflective area is regarded as an area that does not so reflect, regardless of whether the light from the light source is transmitted by the area, absorbed by the area or reflected elsewhere. Accordingly, the term "window" is used herein for the purposes of convenience but not by way of limitation. Thus, windows 11 of code wheel 10 need not be actual openings in the code wheel but may be any means for preventing substantial reflection of light from the light source to the photo detectors, as more fully explained hereinafter.

Figure 5:
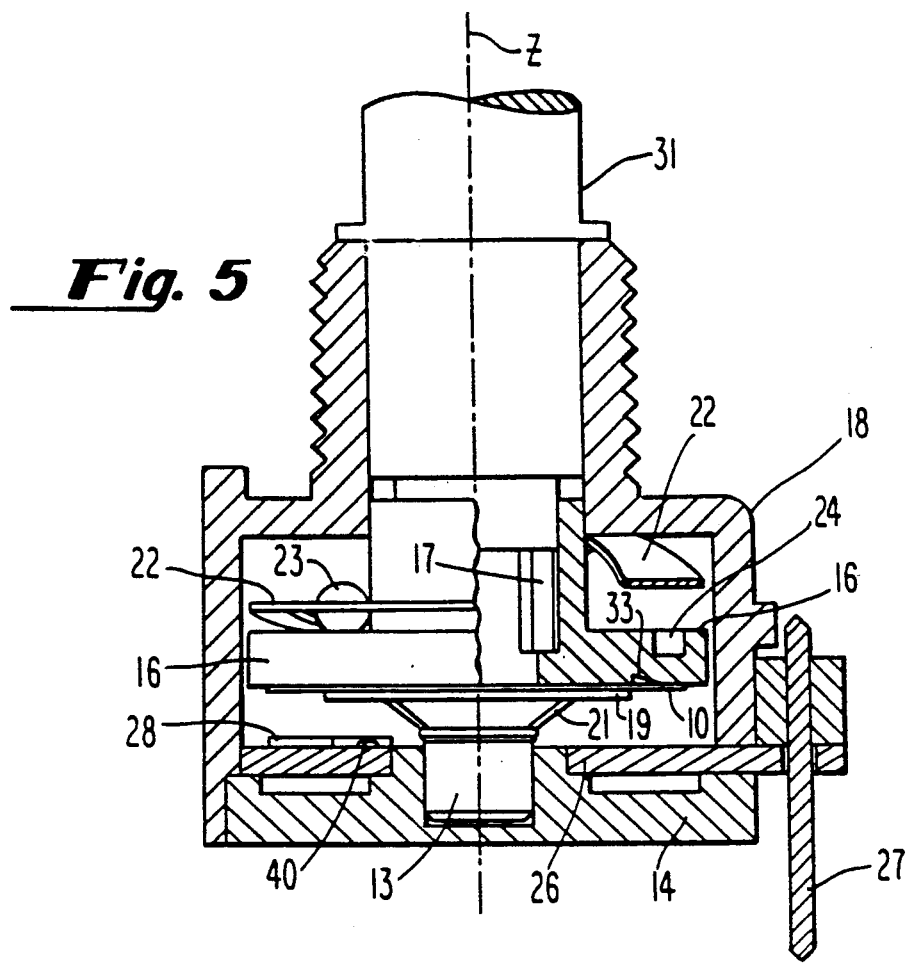
FIG. 5 is a longitudinal cross-section of shaft angle encoder constructed according to one embodiment of the present invention.

The details of a preferred reflective code wheel embodiment are now described in connection with FIGS. 5-9. As shown in FIG. 5, disk shaped hub 16 is mounted on a portion of shaft 31 having spline 17 which assures rotation of the hub with the shaft. The portion of the hub 16 to the left of center line Z in FIG. 5 is illustrated in elevation, and to the right of the center line the hub is illustrated in cross-section. According to one preferred embodiment, code wheel 10 is held tightly against hub 16, and the hub is held on shaft 31 by spring 19 having leaves 21 which frictionally engage the shaft.

On the opposite side of hub 16 from code wheel 10, a generally circular detent spring 22 bears against the inside of housing 18 and biases detent ball 23 toward the back of the hub. A circumferentially extending band of detent holes 24 is formed in the back of hub 16 for engaging ball 23 and providing a tangible indication of hub rotation. Detent ball 23 also serves to lightly restrain hub 16 in any of the plurality of positions corresponding to the location of detent holes 24. Such an arrangement is appropriate where shaft 31 is adapted to be manually adjusted. Detents 24 may be absent in other embodiments.

A printed circuit board (PCB) 26 is mounted on the back plate 14 and extends outside housing 18. A conventional connector on the printed circuit board has a plurality of pins 27 for making electrical connections to components mounted on the board. Four such pins are sufficient when some data processing is performed within housing 18. Photo detector substrate 28 and a light source comprising light emitting diode (LED) 40 are mounted on PCB 26 in a location near the perimeter of the code wheel 10.

Figure 7:
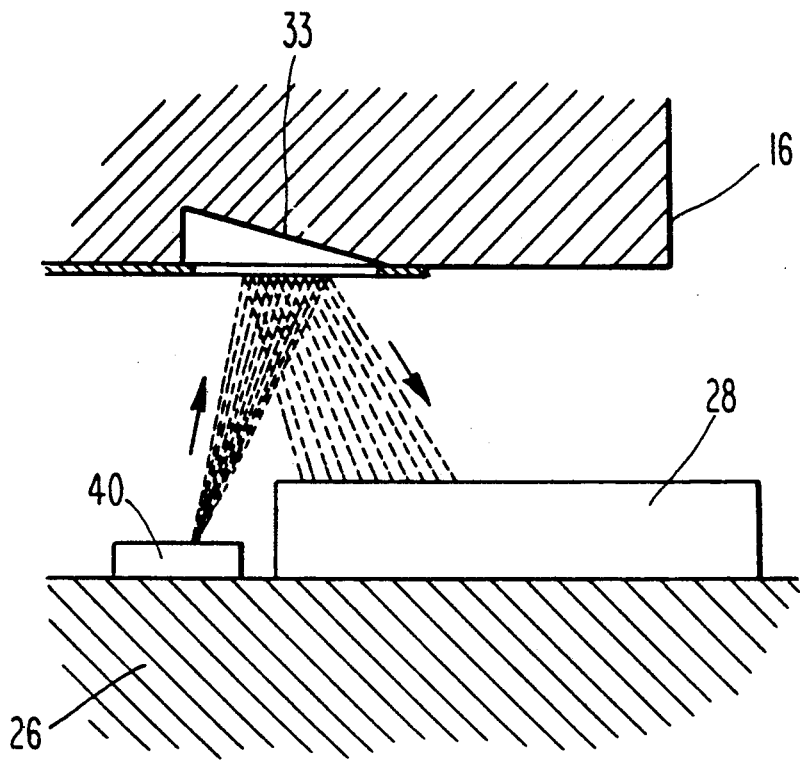
FIG. 7 is a fragmentary, enlarged semi-schematic cross-section including a fragment of the code wheel of the encoder.

Code wheel 10 has a highly reflective face opposite LED 40 and photo detector substrate 28. By reflective it is meant that the face is smooth and flat to provide specular reflection of the light rather than diffuse reflection. As shown in FIGS. 5 and 7, the track of spiral-shaped windows 11 and spokes 12 overlies a conical groove 33 formed in the front face of hub 16. Thus, the portion of hub 16 behind the optical track has a surface that is not parallel to the spokes, that is, the reflective surface, of the code wheel. Any light passing through windows 11 is reflected, if at all, in a direction different from the light reflected specularly from the spokes 12 of code wheel 10. For this reason, the windows 11 are regarded as nonreflective areas between reflective spokes 12. It will be appreciated that other means are available for constructing windows 11 so as to comprise a non-reflective area of the code wheel 10. For example, windows 11 of the code wheel may be diffuse reflectors or absorbers. Such absorbing areas are preferably formed with a one-quarter wave length interference layer for absorption of monochromatic light. In alternate embodiments, hub 16 and code wheel 10 are made integral, such as by injection molding of plastic. In this type of code wheel, windows 11 comprise recessed areas angled to reflect light in directions different from reflection from the flat spokes 12 of code wheel 10. Such recesses define areas that, for the purposes of this invention, are non-reflective. With such an arrangement, the entire face of the code wheel/hub, including spokes 12, may be metallized for good specular reflection. Also, the reflective areas may be curved instead of flat for concentrating light from the emitter onto a small photo detector area. Such curved surfaces may also be specular reflectors when smooth.

Figure 6:
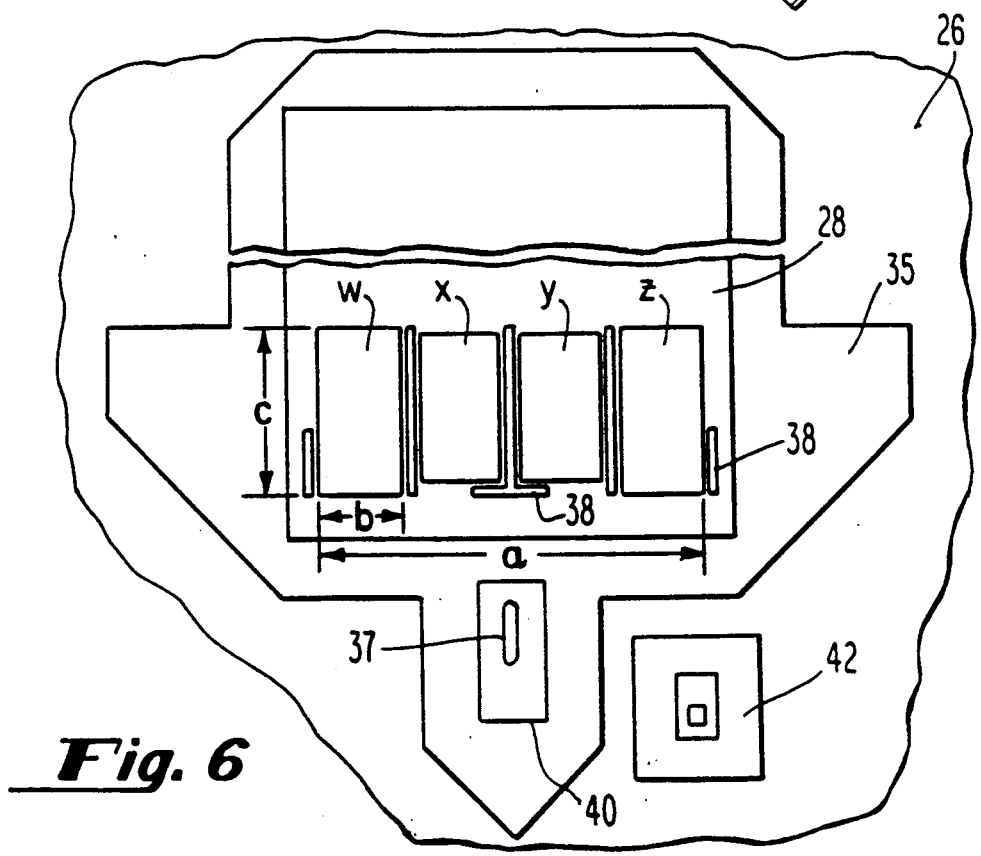
FIG. 6 is a face view of a substrate having a light emitter and a photo detector array.

With particular reference to FIGS. 6–9, LED 40 and photo detector substrate 28 are preferably mounted on gold grounding pad 35 on printed circuit board 26. The LED 40 is a conventional LED which preferably emits essentially monochromatic light from a line 37. As illustrated in FIG. 6, line 37 has some width as it must necessarily have in any practical embodiment. In effect, line 37 is an elongated point source of light. The distance between adjacent photo diodes is preferably the same as the width of the emitting line 37 of LED 40. Such a configuration aids in the compensation for the "non-sharp" edge of the illuminated area and minimizes dark current from the photo diodes thereby enhancing contrast.

Photo detector substrate 28 also includes conventional signal processing circuitry 39 (indicated only schematically in FIG. 9) including two comparitors or operational amplifiers 41. A load resister 42 for LED 40 is mounted on printed circuit board 26 adjacent to substrate 28. Other conventional individual circuit elements are omitted for clarity.

Figure 8:
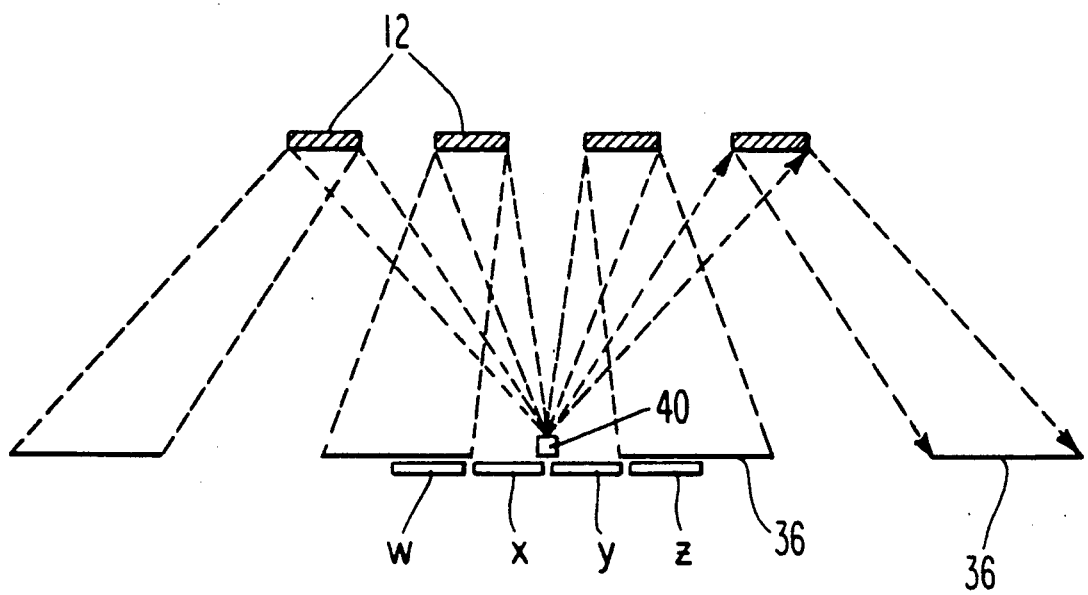
FIG. 8 is a schematic illustration of illumination of photo detectors by light from a light source.
Figure 9:
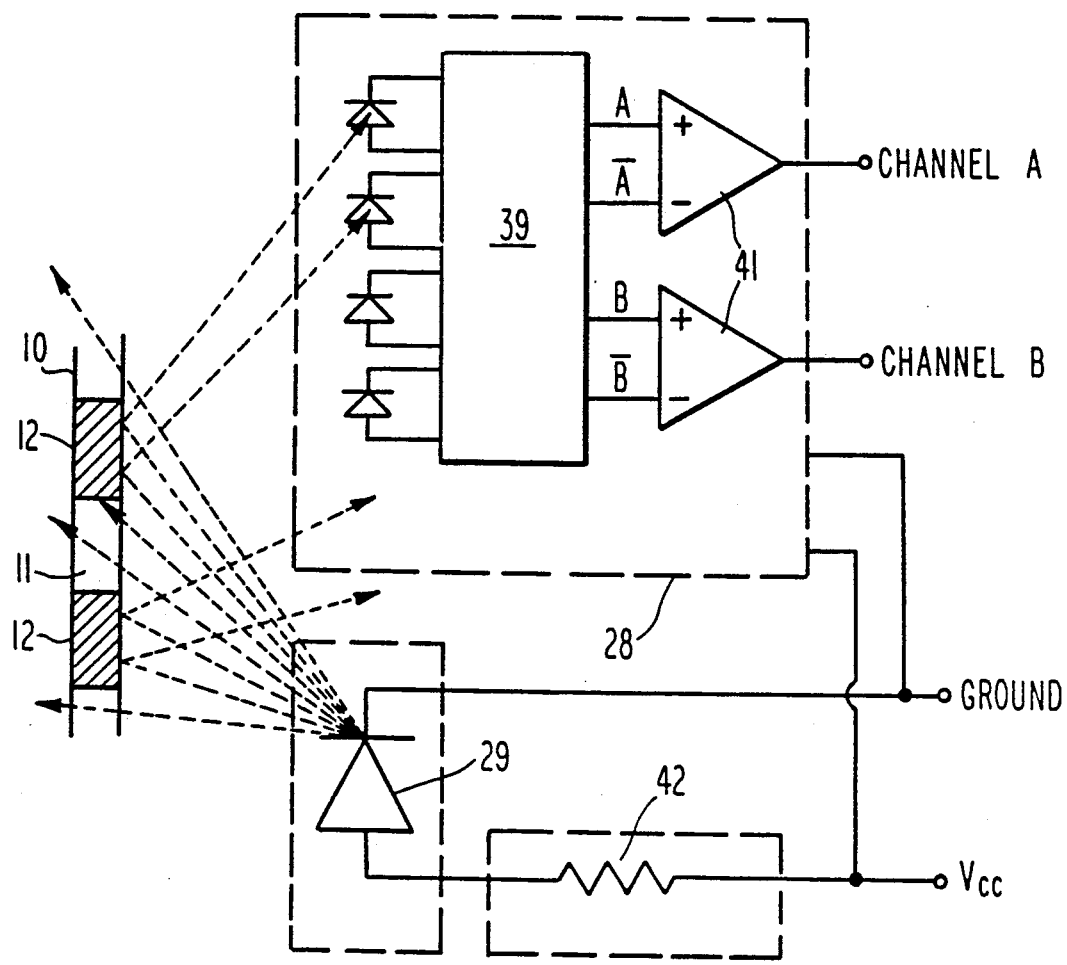
FIG. 9 is a block diagram of an encoder, with illumination indicated schematically.

In operation, as best revealed in FIGS. 7–9, the light emitted from LED 40 strikes the reflective spokes 12 of code wheel 10 as the code wheel rotates. The reflected light forms a spiral-shaped light image which crosses the photo detector array as the wheel rotates. The light from the LED 40 which strikes window 11 is not reflected and as a result the spiral-shaped light images are separated by spiral-shaped dark images of the same size and shape. The general pattern of illumination according to the present embodiment is illustrated schematically by dashed lines in FIGS. 7–9. The illustration treats the source of light from LED 40 as a point source. FIG. 7 illustrates illumination of the photo detector array in a radial plane and FIG. 8 illustrates illumination of an array in a circumferential direction.

It will be appreciated by those skilled in the art that the light and dark spiral images created by reflective code wheels are magnified with respect to the dimensions of the windows and spokes of the code wheel. In particular, as shown in the drawings, the light diverges from the light source toward the reflective areas. It is reflected at an angle of incidence and travels substantially the same distance back to the photo detectors.

Thus, it continues to diverge, and the area is magnified according to the following equation:

$$M = (d1 + d2)/d2$$

where,
d1 is the distance from the spokes of the code wheel to the light source, and
d2 is the distance from the spokes of the code wheel to the photo detector array Thus, since d1 is approximately equal to d2, the projected spiral image is approximately twice the size of the spiral shaped spokes 12. It will be appreciated by those skilled in the art, however, that in most practical embodiments, d1 and d2 are not precisely identical. With particular reference to FIG. 7, for example, it is seen that LED 40 may not always be the same distance from the spokes 12 as photo detector substrate 28. Moreover, while LED 40 and photo detectors 29 in the illustrated embodiment are approximately in a plane parallel to the plane of the code wheel, 10 such perfect alignment is not always possible in practical embodiments. The divergence of the light may therefore be slightly less from the reflector to the photo detectors than from the LED 40 to the reflective area. Parallax may also cause this relationship to be slightly less than precise. These and other discrepancies are all believed to be minor, however.

It will also be apparent to those skilled in the art that the photo detectors are alternately illuminated and not illuminated by the modulated light as the band of reflective areas rotates. Thus, the signals produced by the photo diodes are similar to and can be processed in the same manner as, the signals transmitted through the windows in the code wheel in the Leonard patent. For example, in embodiments having four detector areas in the photo detector array, the four signals produced by the four areas have the same shape but are 90° out of phase relative to one another.

According to preferred embodiments of the reflective code wheels of the present invention, the two inner photo detector areas x and y may be made slightly smaller than the outboard photo detector areas w and z, as shown in FIG. 6. The 5 length of the optical path between LED 40 and the outboard photo detector areas w and z is slightly longer than the path to the in-board photo detectors x and y. The light intensity at the outboard photo detectors is therefore slightly less. The photo detector areas x and z are, therefore, increased slightly so that approximately the same total flux illuminates each of the photo detector areas. This refinement is of less significance when two or more cycles of photo detectors are used, since the flux from in-board and outboard photo detectors in the channel are integrated. Moreover, such a refinement is relatively minor and accordingly the total area of the photo detector illuminated by the light spiral images nevertheless remains substantially constant as that term is used herein.

According to a preferred embodiment of the reflective code wheel of the present invention, the optical radius of photo detector array is about 5280 microns. For reflective code wheels, the preferred photo detector array is comprised of four individual rectangular photo detector areas w, x, y and z, each area having a height c of about 760 microns and a width b of about 410 microns. When reflective code wheels are employed, it is preferred that the spacing between the individual photo detector areas is about equal to the width of LED 40, which is preferably about 60 microns. Accordingly, the overall width a, as measured from the midpoints of the outer dummy doped areas 38, of photo detector array 29 is preferably about 1880 microns. The distance from the spokes 12 to detector 29 is preferably about 1400 microns, and the distance from the spokes to LED 40 is preferably about 1270 microns. Accordingly, the magnification M is about 1.91. For a 16 CPR reflective code wheel, therefore, the photo detector array is preferably oriented at an angle $\theta$ of about 28° with respect to a radial line passing through the center of the photo detector array, and the spiral constant is preferably about 0.01050. Table 2 below provides the preferred values of $\theta$ and K for reflective code wheels having various values of CPR.

TABLE 2

Values of $\theta$ and K for reflective code wheel having optical radius of about 5280 microns and detector width of about 1880 microns.

| N (CPR) | $\theta$ (DEG.) | K (DEG./uM) |
|---|---|---|
| 32 | 71.78° | .00187 |
| 28 | 56.22° | .00380 |
| 24 | 45.43° | .00560 |
| 20 | 36.42° | .00771 |
| 16 | 28.38° | .01050 |
| 12 | 20.87° | .01491 |
| 8 | 13.74° | .02325 |
| 4 | 6.82° | .04753 |
| 1 | 1.70° | .19140 |

CODE STRIPS

Figure 10:
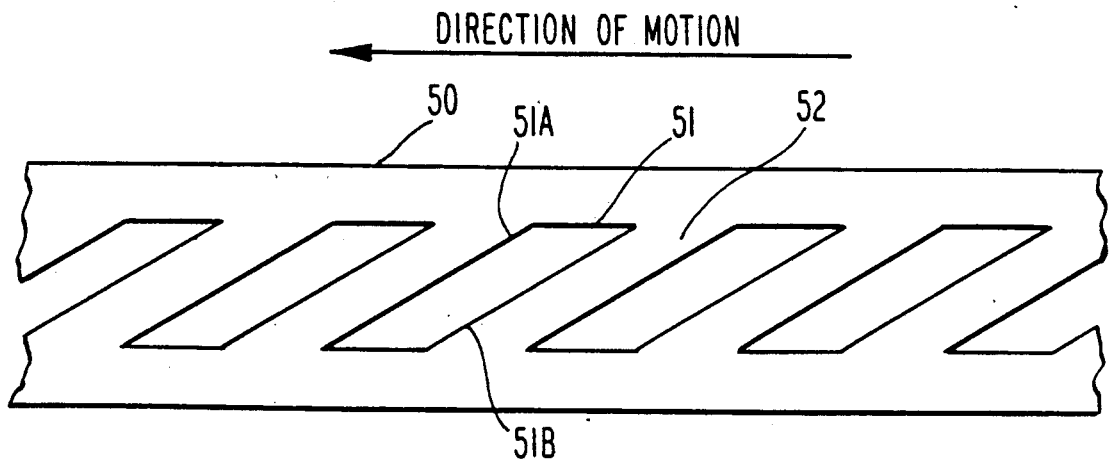
FIG. 10 is a plan view of a code strip according to one embodiment of the present invention.

While the modulating means illustrated in FIGS. 1-9 are code wheels attached to a shaft, it will be appreciated that other embodiments are possible within the scope of the present invention. For example, the modulating means may comprise a code strip, such as shown in FIG. 10, for tracking movement or position along a route. The code strip comprises a rectangular member 50 having windows 51 and spokes 52. As shown in FIG. 10 each window 51 has a leading edge 51A and a trailing edge 51B. The leading edges 51A and trailing edges 51B are not substantially perpendicular to the direction of movement of the code strip, as shown. Thus, these spokes and windows are spiral shaped within the meaning of the present invention. In the embodiment of FIG. 10, the leading and trailing edges define substantially straight parallel lines. It will be appreciated by those skilled in the art that code strip 50 may be used to modulate a light beam in a manner substantially analogous to that described above with respect to the code wheel embodiments. For example, photo detector array is preferably oriented such that the leading edges 51A and trailing edges 51B ar substantially parallel to the interface between the individual photo detectors.

THE METHODS

The present invention also provides methods for producing an electrical signal indicative of the mechanical movement of an object. The methods are of the type which require providing a source of illumination and modulating the light from the source of illumination in response to movement of the object.

An important aspect of the present methods relates to the step of modulating the light from the light source. In particular, the modulation step preferably comprises modulating the light from the light source to provide spiral-shaped light images separated by spiral-shaped dark images. The modulation step even more preferably comprises modulating the light into spiral-shaped light and dark images of substantially the same size and shape It is preferred that the light and dark images are shaped according to equations 1 or 3 described above.

The present methods also require the step of converting the modulated light into electrical signals indicative of the position or movement of the object. This is preferably achieved by holding an interdigitated photo detector array in the path of said modulated light. The photodetector array is preferably configured and oriented as described above and as illustrated in the accompanying figures. The details and other aspects of the present methods are fully disclosed in connection with the description of the apparatus above.

Although particular embodiments of this invention have been described in detail for purposes of illustration, it will be appreciated that various modifications are within the spirit and scope of the invention. The appended claims are intended to cover all such modifications.

What is claimed is:

1. An optical encoder for generating a signal reflective of the movement of an object along a predetermined route comprising:
   (a) a light source for emitting a light beam along a light path;
   (b) moveable modulating means, positioned in said light path, for modulating said light beam in response to the movement of the object, said modulating means comprising an optical track positioned in said light path to provide spiral shaped light images separated by spiral shaped dark images; and
   (c) an interdigitated photo detector array positioned to receive said modulated light and for generating said signal in response to light incident thereon, wherein said photodetector array is oriented with respect to said images such that the photo detector surface area on which said spiral shaped images are incident is substantially constant as said object moves along its route.

2. The encoder of claim 1 wherein:
   (a) said spiral shaped light images have leading edges and trailing edges; and
   (b) said photodetector array comprises a plurality of adjacent photo detector areas oriented such that the portions of said leading and trailing edges which illuminate the photodetector array are substantially parallel to the interfaces between the photo detector areas.

3. The optical encoder of claim 1 wherein the object is a rotatable shaft and said modulating means comprises a code wheel coupled to the shaft for modulating said light beam in response to the rotation of the shaft, said code wheel having a circumferential track of spiral shaped windows separated by spiral shaped spokes positioned in said light path.

4. The encoder of claim 3 wherein said code wheel is located between said light source and said photo detector array.

5. The encoder of claim 4 wherein said windows comprise areas of said code wheel substantially transmissive to light from said light source and said spokes comprise areas of said code wheel substantially non-transmissive to light from said light source.

6. The encoder of claim 4 wherein said photo detector array is a rectangular photo detector array comprised a plurality of individual rectangular photo detector areas immediately adjacent to one another, said array being held in plane substantially parallel to the plane of said code wheel.

7. The encoder of claim 6 wherein the angle formed between a line parallel to the long side of said photo detector array and a radial line in the plane of said photo detector array which passes through about the center of the detector array is equal to about the value of $\theta$ determined as follows:

$$\theta = \sin^{-1}(N\,W/(2\pi R\,M))$$

where,

N is the number of counts per revolution of the code wheel,

W is the usable width of said photo detector array,

R is the optical radius of said photo detector array, and

M is the magnification of the projected light spiral image.

8. The encoder of claim 7 wherein the spiral images have leading edges and trailing edges shaped according to about the following equation in polar coordinates:

$$K = 360(\cos(\theta)/(N\,W)).$$

origin of said polar coordinate system.

9. The encoder of claim 3 wherein said light source and said photo detector array are located on the same side of said code wheel.

10. The encoder of claim 9 wherein said spokes comprise reflective areas of said code wheel and said windows comprise substantially non-reflective areas of said code wheel.

11. The encoder of claim 10 wherein said photo detector array is a rectangular photo detector array comprised of a plurality of individual rectangular photo detector areas immediately adjacent to one another, said array being held in a plane substantially parallel to the plane of said code wheel.

12. The encoder of claim 11 wherein the angle formed between a line parallel to the long side of said photo detector array and a radial line in the plane of said photo detector array which passes through about the center of the detector array is equal to about the value of $\theta$ determined as follows:

$$\theta = \sin^{-1}(N\,W/(2\pi R\,M))$$

where,

N is the number of counts per revolution of the code wheel,

W is the usable width of said photo detector array,

R is the optical radius of said photo detector

M is the magnification of the projected light spiral image.

13. The encoder of claim 11 wherein the spiral images have leading edges and trailing edges shaped according to about the following equation in polar coordinates:

$$K = 360(\cos(\theta)/(N\,W)).$$

where the axis of rotation of said code wheel passes through the origin of said polar coordinate system.

14. A method for generating a signal reflective of the movement of an object along a predetermined route comprising:
  (a) emitting a light beam along a light path;
  (b) modulating said light beam in response to the movement of the object by positioning an optical track in said light path to provide spiral shaped light images separated by spiral shaped dark images; and
  (c) positioning an interdigitated photo detector array to receive said modulated light whereby said interdigitated photo detector array is oriented with respect to said images so that the photo detector surface area on which said spiral shaped images are incident is substantially constant as said object moves along its route and whereby said signal is generated in response to light incident on said interdigitated photo detector array.

15. The method of claim 14 wherein:
  (a) said spiral shaped light images have leading and trailing edges; and
  (b) said photo detector array comprises a plurality of adjacent photo detector areas oriented such that the portions of said leading and trailing edges which illuminate the photodetector array are substantially parallel to the interfaces between the photo detector areas.

16. The method of claim 15 wherein the object is a rotatable shaft and said modulating step comprises placing the optical track of a code wheel in said light path, said optical track comprising a circumferential track of spiral shaped windows separated by spiral shaped spokes.

17. The method of claim 16 wherein said code wheel is located between said light source and said photo detector array.

18. The method of claim 17 wherein said windows comprise areas of said code wheel substantially transmissive to light from said light source and said spokes comprise areas of said code wheel substantially non-transmissive to light from said light source.

19. The method of claim 18 wherein said photo detector array is a rectangular photo detector array comprised a plurality of individual rectangular photo detector areas immediately adjacent to one another, said array being held in plane substantially parallel to the plane of said code wheel.

20. The method of claim 16 wherein said light source and said photo detector array are located on the same side of said code wheel.

21. The method of claim 20 wherein said spokes comprise reflective areas of said code wheel and said windows comprise substantially non-reflective areas of said code wheel.

22. The method of claim 21 wherein said photo detector array is a rectangular photo detector array comprised of a plurality of individual rectangular photo detector areas immediately adjacent to one another, said array being held in a plane substantially parallel to the plane of said code wheel.

* * * * *